(12) United States Patent
Tain et al.

(10) Patent No.: US 11,337,303 B2
(45) Date of Patent: May 17, 2022

(54) CIRCUIT BOARD STRUCTURE

(71) Applicant: Unimicron Technology Corp., Taoyuan (TW)

(72) Inventors: Ra-Min Tain, Hsinchu County (TW); Chi-Chun Po, New Taipei (TW); Po-Hsiang Wang, New Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 16/533,808

(22) Filed: Aug. 7, 2019

(65) Prior Publication Data

US 2021/0014963 A1     Jan. 14, 2021

(30) Foreign Application Priority Data

Jul. 8, 2019   (TW) .................................. 108123923

(51) Int. Cl.
*H05K 1/02* (2006.01)
*H05K 7/20* (2006.01)
*H05K 1/05* (2006.01)

(52) U.S. Cl.
CPC ......... *H05K 1/0272* (2013.01); *H05K 1/0204* (2013.01); *H05K 1/05* (2013.01); *H05K 7/20409* (2013.01); *H05K 2201/064* (2013.01)

(58) Field of Classification Search
CPC ............... H01L 2924/00; H01L 23/473; H01L 2924/181; H01L 23/427; H01L 2224/32225; H01L 2224/16225; H01L 2924/14; H01L 2924/1517; H01L 2225/06589; H01L 23/49827;

(Continued)

(56) References Cited

U.S. PATENT DOCUMENTS 5,763,951 A    6/1998  Hamilton et al.
6,184,578 B1 * 2/2001  Gardner ............... H01L 23/427
                                                257/712

(Continued)

FOREIGN PATENT DOCUMENTS

CN        103841750         6/2014
CN        108198793         6/2018

(Continued)

OTHER PUBLICATIONS

"Office Action of Taiwan Counterpart Application," dated Jan. 16, 2020, p. 1-p. 11.

(Continued)

*Primary Examiner* — Mandeep S Buttar
(74) *Attorney, Agent, or Firm* — JCIPRNET

(57) ABSTRACT

A circuit board structure includes a carrier and a patterned circuit layer. The patterned circuit layer is disposed on the carrier, and the patterned circuit layer has at least one fluid channel therein. The fluid channel has a heat absorption section and a heat dissipation section relative to the heat absorption section. A heat source is electrically connected to the patterned circuit layer, and the heat absorption section is adjacent to the heat source. The heat generated by the heat source is transferred from the patterned circuit layer to the heat absorption section of the fluid channel, and is transferred from the heat absorption section to the heat dissipation section for heat dissipation.

15 Claims, 5 Drawing Sheets

(58) Field of Classification Search
CPC ............... H01L 23/367; H01L 23/3735; H01L 23/49822; H01L 21/76877; H01L 23/3672; H01L 21/4857; G06F 1/20; G06F 1/206; G06F 2200/201; H05K 7/20254; H05K 1/0204; H05K 7/20336; H05K 1/0206; H05K 7/20281; H05K 2201/064; H05K 2201/10416; H05K 1/0203; H05K 1/0272; H05K 1/185; H05K 2201/066; H05K 7/20; H05K 7/20418; H05K 7/20263; H05K 7/205; H05K 7/20872; H05K 7/20927; H05K 7/20936
USPC .................. 361/719, 720, 679.54, 689, 709; 165/104.26, 296; 257/23.098
See application file for complete search history.

(56) References Cited

U.S. PATENT DOCUMENTS

| | | | | |
|---|---|---|---|---|
| 6,368,704 | B1* | 4/2002 | Murata | C09J 9/02 252/500 |
| 6,377,457 | B1* | 4/2002 | Seshan | H01L 23/467 165/104.33 |
| 6,697,257 | B1* | 2/2004 | Wolf | H01L 23/5385 361/708 |
| 6,914,780 | B1* | 7/2005 | Shanker | F28D 15/0233 165/104.33 |
| 6,946,601 | B1* | 9/2005 | Lee | H05K 3/323 174/534 |
| 8,659,144 | B1* | 2/2014 | Sutardja | H01L 23/49822 257/691 |
| 9,618,275 | B1* | 4/2017 | Anderson | F28D 15/046 |
| 2002/0063330 | A1* | 5/2002 | Macris | H01L 35/34 257/712 |
| 2010/0177519 | A1* | 7/2010 | Schlitz | F21V 29/763 362/294 |
| 2010/0244236 | A1* | 9/2010 | Yun | H01L 23/3733 257/713 |
| 2013/0081787 | A1* | 4/2013 | Hsieh | F28D 15/02 165/104.21 |
| 2014/0144677 | A1* | 5/2014 | Wang | H05K 1/0206 174/252 |
| 2014/0177188 | A1* | 6/2014 | Stephanou | B23K 26/206 361/760 |
| 2015/0382463 | A1* | 12/2015 | Kim | H01L 25/50 361/767 |
| 2016/0007504 | A1* | 1/2016 | Wu | H05K 1/0203 361/700 |
| 2018/0153030 | A1* | 5/2018 | Viswanathan | H01L 23/15 |
| 2019/0098743 | A1* | 3/2019 | Molla | H01L 23/3736 |

FOREIGN PATENT DOCUMENTS

| | | |
|---|---|---|
| JP | 2006156979 | 6/2006 |
| TW | 591984 | 6/2004 |
| TW | I303553 | 11/2008 |
| TW | M486933 | 9/2014 |

OTHER PUBLICATIONS

"Office Action of China Counterpart Application", dated Jun. 3, 2021, p. 1-p. 9.

* cited by examiner

CIRCUIT BOARD STRUCTURE

CROSS-REFERENCE TO RELATED APPLICATION

This application claims the priority benefit of Taiwan application serial no. 108123923, filed on Jul. 8, 2019. The entirety of the above-mentioned patent application is hereby incorporated by reference herein and made a part of this specification.

BACKGROUND OF THE INVENTION

1. Field of the Invention

The present invention relates to a circuit board structure, and particularly relates to a circuit board structure with a better heat dissipation effect.

2. Description of Related Art

In general, in order to solve the heat dissipation problem of the circuit board structure, usually, a micro-fluidic channel is manufactured or a heat pipe is embedded in a dielectric substrate made of an epoxy glass cloth laminate (FR-4). However, the micro channel or the heat pipe still needs to be structurally connected to the heat source through other media or mechanisms to transfer the heat generated by the heat source to the outside. If the used medium or heat transfer mechanism is not well designed, the heat dissipation effect of the circuit board structure will be greatly reduced, and the functions of the micro-fluidic channel or the heat pipe cannot be fully exerted.

SUMMARY OF THE INVENTION

The present invention is directed to a circuit board structure which is suitable for carrying at least one heat source and has a better heat dissipation effect.

The circuit board structure of the present invention includes a carrier and a patterned circuit layer. The patterned circuit layer is disposed on the carrier, and the patterned circuit layer is provided with at least one fluid channel therein. The fluid channel is provided with a heat absorption section and a heat dissipation section relative to the heat absorption section. A heat source is electrically connected to the patterned circuit layer, and the heat absorption section is adjacent to the heat source. The heat generated by the heat source is transferred from the patterned circuit layer to the heat absorption section of the fluid channel, and is transferred from the heat absorption section to the heat dissipation section for heat dissipation.

In an embodiment of the present invention, the carrier is an insulating substrate, and the patterned circuit layer is directly disposed on the carrier.

In an embodiment of the present invention, a material of the insulating substrate includes epoxy glass cloth laminate (FR-4), epoxy resin, prepreg (PP) or ceramics.

In an embodiment of the present invention, the circuit board structure further includes a heat sink which is embedded in the carrier and provided with a first surface and a second surface opposite to each other. The first surface is in direct contact with the patterned circuit layer, and the second surface is aligned with a lower surface of the carrier.

In an embodiment of the present invention, the circuit board structure further includes a dielectric layer and a heat dissipation fin. The dielectric layer is disposed on the lower surface of the carrier, the heat dissipation fin is disposed on the dielectric layer, and the dielectric layer is positioned between the carrier and the heat dissipation fin.

In an embodiment of the present invention, the circuit board structure further includes a dielectric layer and a heat dissipation fin. The dielectric layer is disposed on the patterned circuit layer, the heat dissipation fin is disposed on the dielectric layer, and the dielectric layer is positioned between the patterned circuit layer and the heat dissipation fin.

In an embodiment of the present invention, the carrier is a metal substrate, and a material of the metal substrate includes copper, aluminum or alloy.

In an embodiment of the present invention, the circuit board structure further includes a dielectric layer which is disposed between the patterned circuit layer and the carrier.

In an embodiment of the present invention, a heat conductivity coefficient of the dielectric layer is greater than 1 W/(m·K).

In an embodiment of the present invention, the circuit board structure further includes a heat dissipation fin which is disposed on the carrier, and the carrier is positioned between the patterned circuit layer and the heat dissipation fin.

In an embodiment of the present invention, the circuit board structure further includes an adhesive material which is disposed between the heat source and the patterned circuit layer.

In an embodiment of the present invention, the adhesive material includes solder, conductive paste or dielectric paste.

In an embodiment of the present invention, the fluid channel is filled with a heat dissipation fluid, and the heat dissipation fluid circulates between the heat absorption section and the heat dissipation section.

In an embodiment of the present invention, the heat dissipation fluid is a dielectric fluid, and the dielectric fluid includes liquid or gas.

In an embodiment of the present invention, the at least one fluid channel includes a plurality of fluid channels, and the fluid channels are separately positioned in the patterned circuit layer.

In an embodiment of the present invention, a thickness of the patterned circuit layer is between 10 microns and 75 microns.

In an embodiment of the present invention, a pore size of the fluid channel is between 5 microns and 50 microns.

In an embodiment of the present invention, the heat source includes at least one chip or at least one package.

In an embodiment of the present invention, the orthographic projection of the heat source on the carrier is overlapped with the orthographic projection of the heat absorption section of the fluid channel on the carrier.

In an embodiment of the present invention, the heat source is electrically connected to the patterned circuit layer by at least one wire.

Based on the above, in the design of the circuit board structure of the present invention, the fluid channel is formed in the patterned circuit layer, and the heat absorption section of the fluid channel is adjacent to the heat source. Therefore, the heat generated by the heat source is transferred from the patterned circuit layer to the heat absorption section of the fluid channel, and is transferred from the heat absorption section to the heat dissipation section for heat dissipation. Thus, the circuit board structure of the present invention can quickly transfer the heat generated by the heat source to the outside, having a better heat dissipation effect.

In order to make the above features and advantages of the present invention more obvious and comprehensible, embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
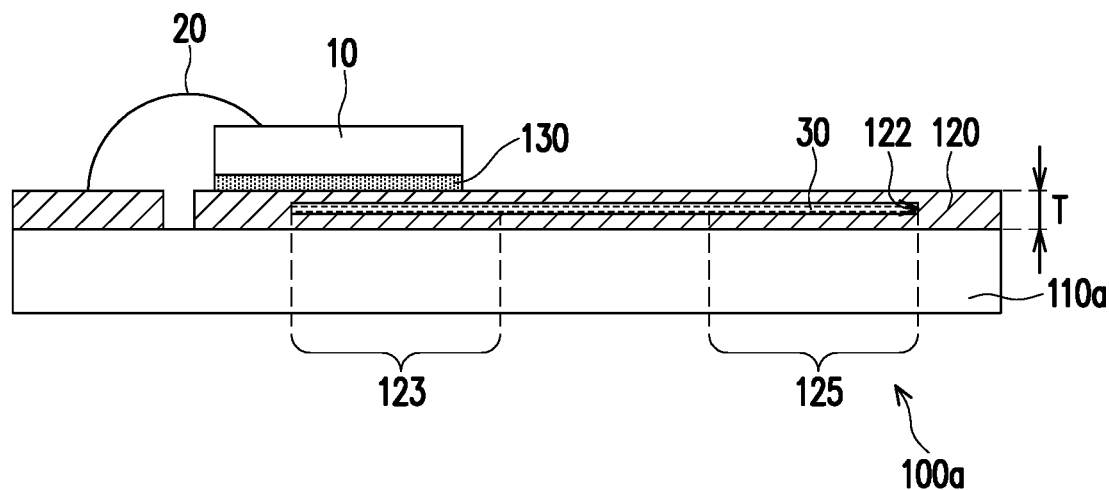
FIG. 1A is a cross-sectional schematic view of a circuit board structure according to an embodiment of the present invention.
Figure 1B:
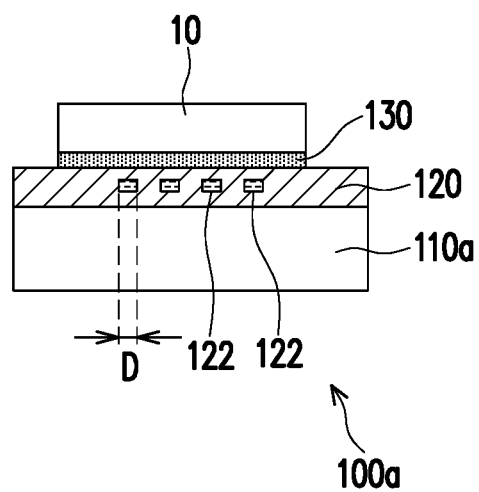
FIG. 1B is a side view of the circuit board structure in FIG. 1A.

FIG. 1A is a cross-sectional schematic view of a circuit board structure according to an embodiment of the present invention. FIG. 1B is a side view of the circuit board structure in FIG. 1A. Referring to FIG. 1A and FIG. 1B simultaneously, in the present embodiment, a circuit board structure 100a includes a carrier 110a and a patterned circuit layer 120. The patterned circuit layer 120 is disposed on the carrier 110a, and the patterned circuit layer 120 is provided with at least one fluid channel therein (four fluid channels 122 are schematically shown in FIG. 1B). The fluid channel 122 is provided with a heat absorption section 123 and a heat dissipation section 125 relative to the heat absorption section 123. A heat source 10 is electrically connected to the patterned circuit layer 120, and the heat absorption section 123 is adjacent to the heat source 10. The heat generated by the heat source 10 is transferred from the patterned circuit layer 120 to the heat absorption section 123 of the fluid channel 122, and is transferred from the heat absorption section 123 to the heat dissipation section 125 for heat dissipation.

In detail, the carrier 100a of the present embodiment is specifically implemented as an insulating substrate. The material of the insulating substrate is, for example, epoxy glass cloth laminate (FR-4), epoxy resin, prepreg (PP) or ceramics, but is not limited thereto. The patterned circuit layer 120 is directly disposed on the carrier 110a, and the fluid channels 122 are separately positioned in the patterned circuit layer 120. Particularly, the patterned circuit layer 120 of the present embodiment is formed by 3D printing, and the unprinted portion is the position of the fluid channel 122. Herein, the thickness T of the patterned circuit layer 120 is between 10 microns and 75 microns, and the pore size D of the fluid channel 122 is between 5 microns and 50 microns. Preferably, the thickness T of the patterned circuit layer 120 is 70 microns, and the pore size D of the fluid channel 122 is 18 microns.

The heat source 10 may be at least one chip or at least one package. The heat source 10 is electrically connected to the patterned circuit layer 120 by at least one wire (one wire 20 is schematically shown in FIG. 1A), but is not limited thereto. In other embodiments not shown, the heat source can also be electrically connected to the patterned circuit layer in a flip chip manner, which is still within the protective scope of the present invention. Furthermore, the circuit board structure 100a of the present embodiment also includes an adhesive material 130. The adhesive material 130 is disposed between the heat source 10 and the patterned circuit layer 120. Herein, the adhesive material 130 is, for example, solder, conductive paste or dielectric paste. The conductive paste is, for example, copper paste, silver paste, carbon paste, nano silver or conductive polymer material, but is not limited thereto. Preferably, as shown in FIG. 1A and FIG. 1B, the orthographic projection of the heat source 10 on the carrier 110a is overlapped with the orthographic projection of the heat absorption section 123 of the fluid channel 122 on the carrier 110a. That is, the heat source 10 is relatively adjacent to the fluid channel 122 in the patterned circuit layer 120.

Furthermore, the fluid channel 122 of the present embodiment is filled with a heat dissipation fluid 30. The heat dissipation fluid 30 is, for example, a dielectric fluid, and the dielectric fluid includes liquid (such as pure water) or gas. It should be noted that the fluid channel 122 is not filled up with the heat dissipation fluid 30, so that the heat dissipation fluid 30 can freely flow in the fluid channel 122. Furthermore, the sectional view of the fluid channel 122 of the present embodiment may be, for example, in a circular shape, a rectangular shape, a zigzag shape, a square wave shape or an arc shape, but is not limited thereto. Preferably, the tube wall of the fluid channel 122 has a capillary structure for enabling the heat dissipation fluid 30 to circulate between the heat absorption section 123 and the heat dissipation section 125.

In general, an evaporation end is placed at a high-temperature fluid, and a condensation end is placed at a low-temperature fluid, so that a heat transfer phenomenon occurs. Firstly, the heat flow is transferred to the capillary structure by the high-temperature fluid passing through a metal tube wall, so that the working fluid in the capillary structure is started to evaporated, and simultaneously, the vapor flows towards the condensation end of a heat pipe. Because the condensation end of the heat pipe is placed at the low-temperature fluid, when a gaseous working fluid arrives at the condensation end, the gaseous working fluid is started to be condensed into a liquid working fluid, and simultaneously, the heat is transferred from the gaseous working fluid to the capillary structure and the metal tube wall so as to be transferred to the low-temperature fluid outside the condensation end. The condensed liquid working fluid flows from the condensation end to the evaporation end due to a capillary phenomenon, so that the working fluid circulates continuously, and the heat is continuously transferred from the high-temperature fluid to the low-temperature fluid. Specifically, when the heat generated by the heat source 10 is transferred from the patterned circuit layer 120 to the heat absorption section 123 of the fluid channel 122, the temperature of the heat dissipation fluid 30 of this portion increases after the heat is absorbed. Under the action of thermal convection, the high-temperature heat dissipation fluid 30 flows to the heat dissipation section 125, and the low-temperature heat dissipation fluid 30 of the heat dissipation section 125 flows to the heat absorption section 123 to receive the heat. The high-temperature heat dissipation fluid 30 flowing to the heat dissipation section 125 can exchange the heat with the heat dissipation air provided by the external environment so as to lower the temperature of the high-temperature heat dissipation fluid 30. The heat dissipation fluid 30 with reduced temperature is returned to the heat absorption section 123, and the cycle is repeated to improve the heat dissipation efficiency of the circuit board structure 100a.

Because the patterned circuit layer 120 of the present embodiment is provided with the fluid channel 122 therein and the heat absorption section 123 of the fluid channel 122 is adjacent to the heat source 10, the heat generated by the heat source 10 is transferred from the patterned circuit layer 120 to the heat absorption section 123 of the fluid channel 122, and is transferred from the heat absorption section 123 to the heat dissipation section 125 for heat dissipation. Compared with the conventional arrangement of a microfluidic channel or a heat pipe in a dielectric substrate, the fluid channel 122 of the present embodiment is closer to the heat source 10, and the heat-conducting property of the metal patterned circuit layer 120 is much higher than that of the conventional dielectric substrate, so that no special conducting mechanism is required. In brief, the circuit board structure 100a of the present embodiment can quickly transfer the heat generated by the heat source 10 to the outside, having a better heat dissipation effect.

It should be noted here that the following embodiments use the element symbols and partial contents of the above embodiments, in which the same symbols are used to refer to the same or similar elements, and the descriptions of the same technical contents are omitted. The descriptions of the omitted portions can refer to the above embodiments, and the descriptions are omitted in the following embodiments.

Figure 2A:
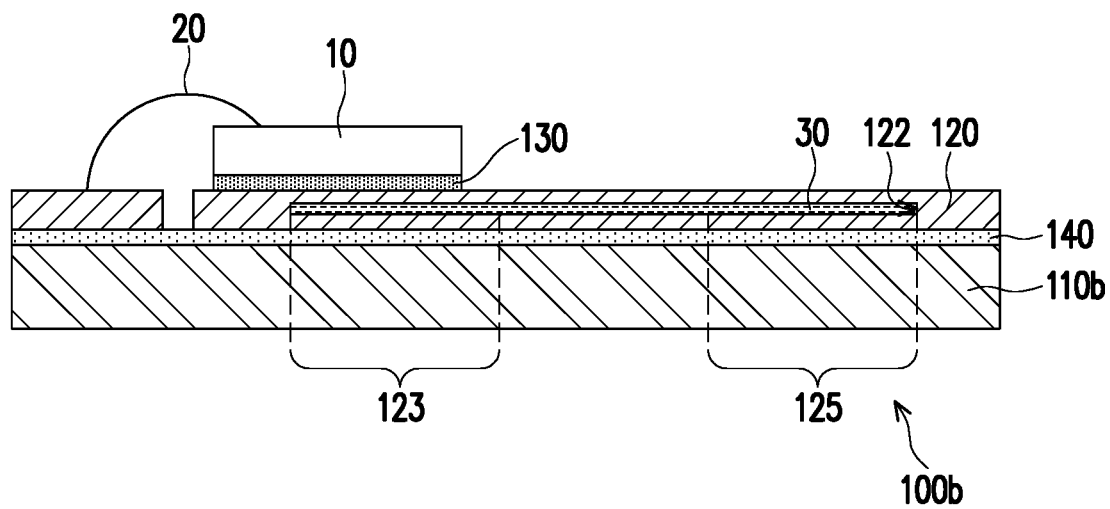
FIG. 2A is a cross-sectional schematic view of a circuit board structure according to another embodiment of the present invention.
Figure 2B:
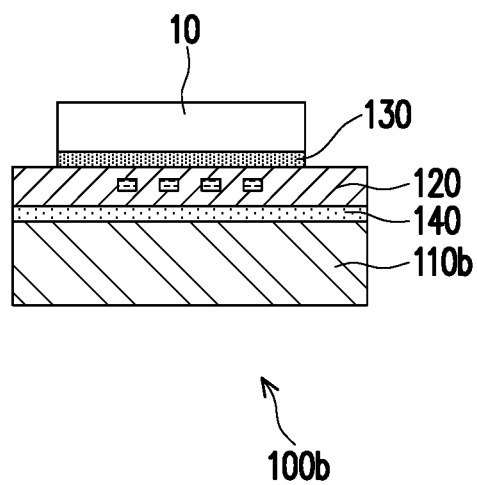
FIG. 2B is a side view of the circuit board structure in FIG. 2A.

FIG. 2A is a cross-sectional schematic view of a circuit board structure according to another embodiment of the present invention. FIG. 2B is a side view of the circuit board structure in FIG. 2A. Referring to FIG. 1A, FIG. 1B, FIG. 2A and FIG. 2B simultaneously, a circuit board structure 100b of the present embodiment is similar to the circuit board structure 100a in FIG. 1A, and the difference between the circuit board structure 100b and the circuit board structure 100a is as follows: a carrier 110b of the present embodiment is specifically implemented as a metal substrate, and the material of the metal substrate includes copper, aluminum or alloy. Furthermore, the circuit board structure 100b of the present embodiment further includes a dielectric layer 140, where the dielectric layer 140 is disposed between the patterned circuit layer 120 and the carrier 110b. Herein, the heat conductivity coefficient of the dielectric layer 140 is greater than 1 W/(m·K). The heat generated by the heat source 10 can be transferred from the patterned circuit layer 120 to the fluid channel 122 for heat dissipation, and also can sequentially pass through the patterned circuit layer 120, the dielectric layer 140 and the carrier 110b so as to be transferred to the external environment for heat dissipation. Therefore, the circuit board structure 100b of the present embodiment can quickly transfer the heat generated by the heat source 10 to the outside, having a better heat dissipation effect.

Figure 3:
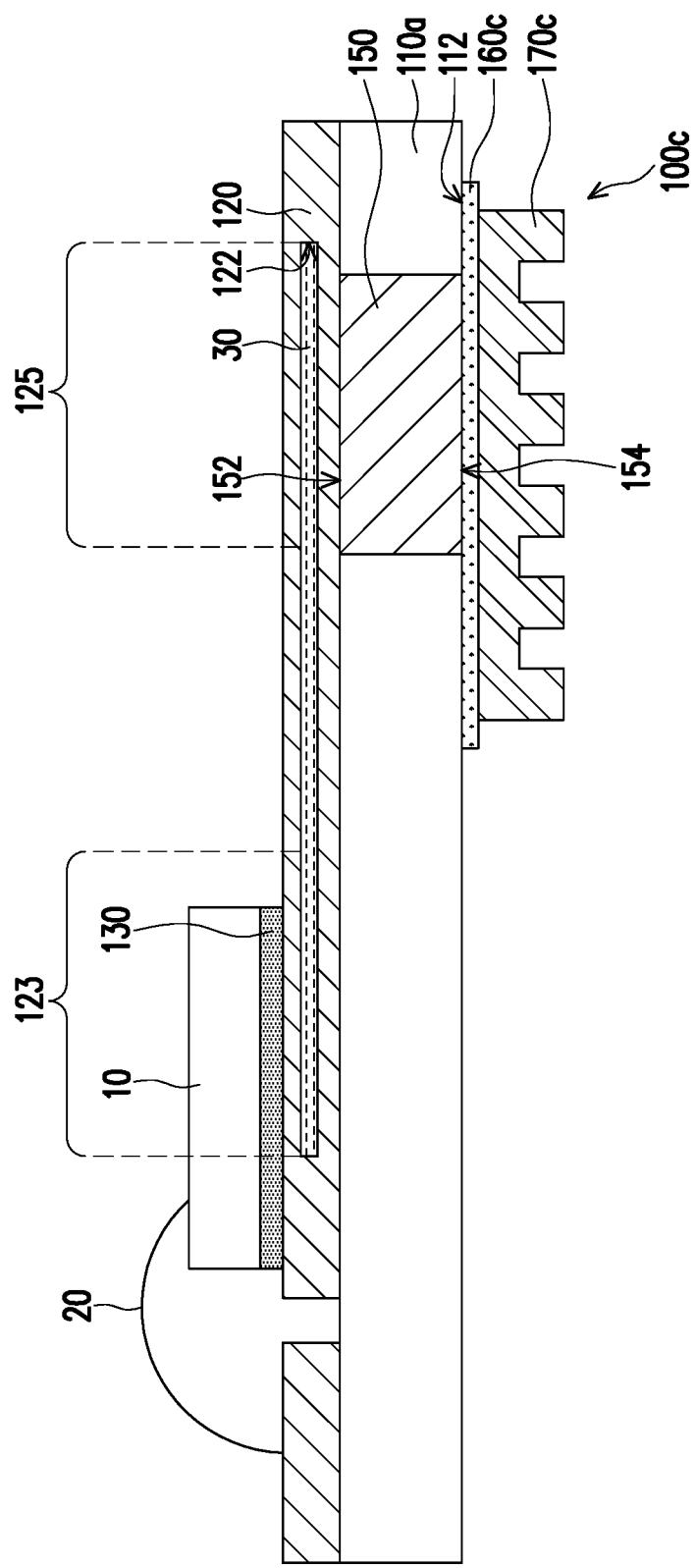
FIG. 3 is a cross-sectional schematic view of a circuit board structure according to another embodiment of the present invention.

FIG. 3 is a cross-sectional schematic view of a circuit board structure according to another embodiment of the present invention. Referring to FIG. 1A and FIG. 3 simultaneously, a circuit board structure 100c of the present embodiment is similar to the circuit board structure 100a in FIG. 1A, and the difference between the circuit board structure 100c and the circuit board structure 100a is as follows: the circuit board structure 100c of the present embodiment further includes a heat sink 150, where the heat sink 150 is embedded in the carrier 110a and is provided with a first surface 152 and a second surface 154 opposite to each other. Herein, the first surface 152 is in direct contact with the patterned circuit layer 120, and the second surface 154 is aligned with a lower surface 112 of the carrier 110a. Furthermore, the circuit board structure 100c also includes a dielectric layer 160c and a heat dissipation fin 170c. The dielectric layer 160c is disposed on the lower surface 112 of the carrier 110a, and the heat conductivity coefficient of the dielectric layer 160c is greater than 1 W/(m·K). The heat dissipation fin 170c is disposed on the dielectric layer 160c, and the dielectric layer 160c is positioned between the carrier 110a and the heat dissipation fin 170c.

As shown in FIG. 3, the heat generated by the heat source 10 can be transferred from the patterned circuit layer 120 to the fluid channel 122 for heat dissipation, and can also sequentially pass through the patterned circuit layer 120, the heat sink 150, the dielectric layer 160c and the heat dissipation fin 170c so as to be transferred to the external environment for heat dissipation. Therefore, the circuit board structure 100c of the present embodiment can quickly transfer the heat generated by the heat source 10 to the outside, having a better heat dissipation effect.

Figure 4:
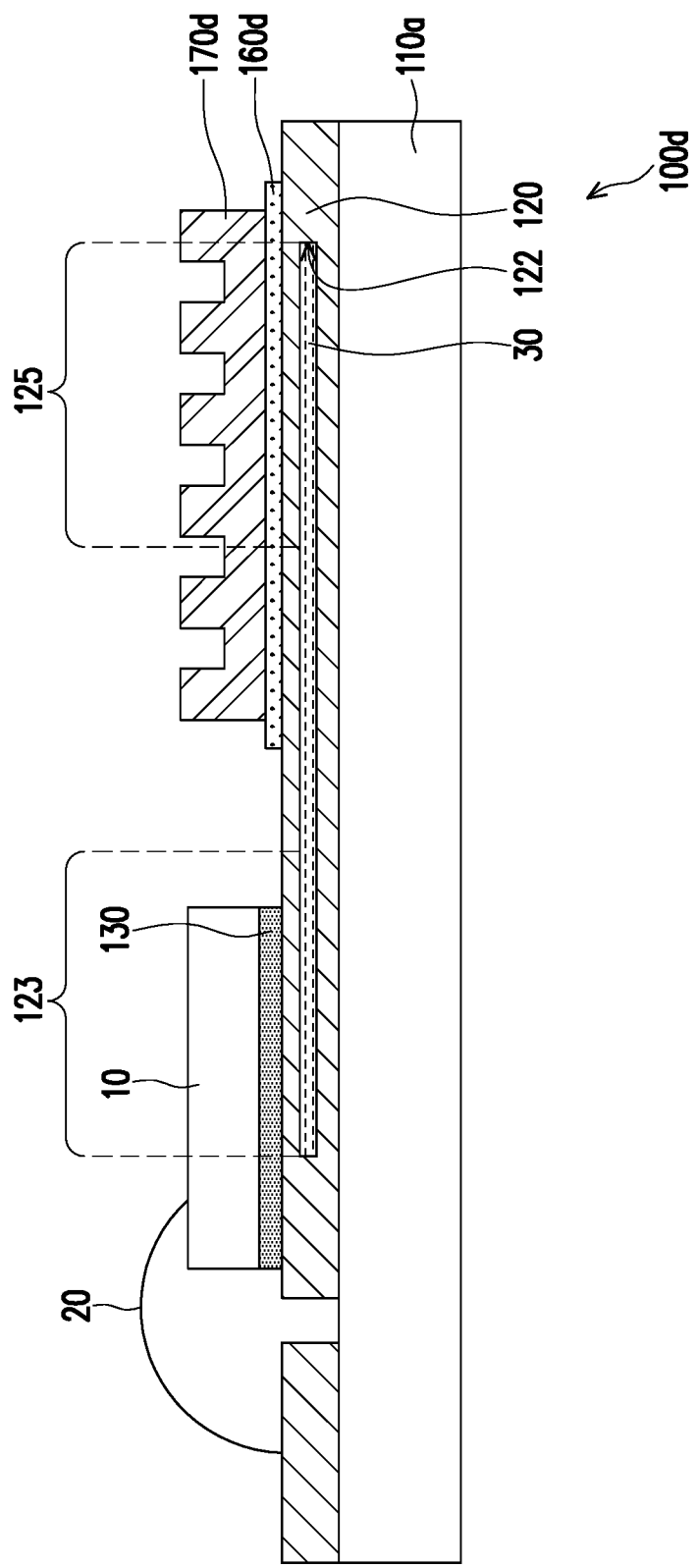
FIG. 4 is a cross-sectional schematic view of a circuit board structure according to another embodiment of the present invention.

FIG. 4 is a cross-sectional schematic view of a circuit board structure according to another embodiment of the present invention. Referring to FIG. 1A and FIG. 4 simultaneously, a circuit board structure 100d of the present embodiment is similar to the circuit board structure 100a in FIG. 1A, and the difference between the circuit board structure 100d and the circuit board structure 100a is as follows: the circuit board structure 100d of the present embodiment further includes a dielectric layer 160d and a heat dissipation fin 170d. The dielectric layer 160d is disposed on the patterned circuit layer 120, and the heat conductivity coefficient of the dielectric layer 160d is greater than 1 W/(m·K). The heat dissipation fin 170d is disposed on the dielectric layer 160d, and the dielectric layer 160d is positioned between the patterned circuit layer 120 and the heat dissipation fin 170d.

As shown in FIG. 4, the heat generated by the heat source 10 can be transferred from the patterned circuit layer 120 to the fluid channel 122 for heat dissipation, and can also sequentially pass through the patterned circuit layer 120, the dielectric layer 160d and the heat dissipation fin 170d so as to be transferred to the external environment for heat dissipation. Therefore, the circuit board structure 100d of the present embodiment can quickly transfer the heat generated by the heat source 10 to the outside, having a better heat dissipation effect.

Figure 5:
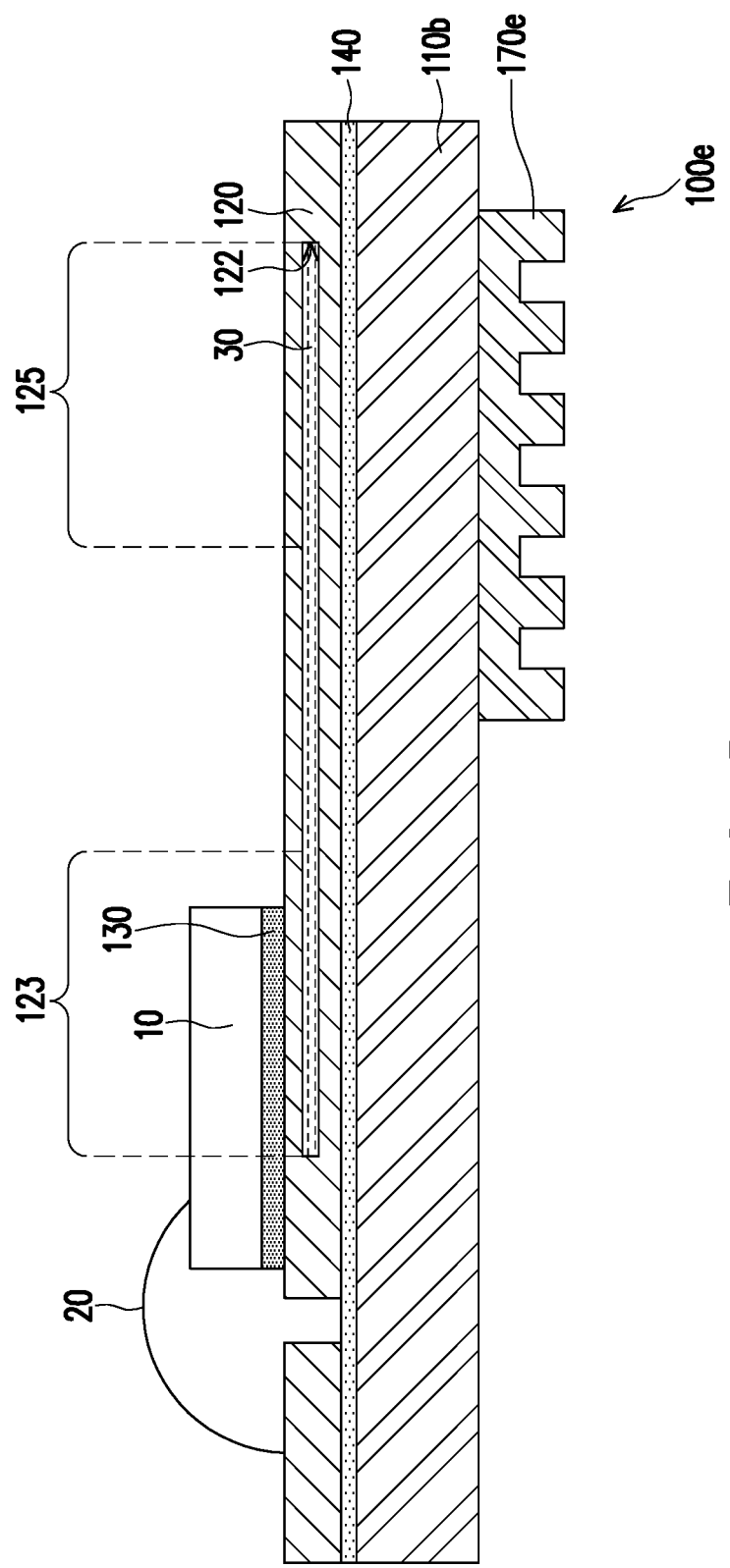
FIG. 5 is a cross-sectional schematic view of a circuit board structure according to another embodiment of the present invention.

FIG. 5 is a cross-sectional schematic view of a circuit board structure according to another embodiment of the present invention. Referring to FIG. 2A and FIG. 5 simultaneously, a circuit board structure 100e of the present embodiment is similar to the circuit board structure 100b in FIG. 2A, and the difference between the circuit board structure 100e and the circuit board structure 100b is as follows: the circuit board structure 100e of the present embodiment also includes a heat dissipation fin 170e, where the heat dissipation fin 170e is disposed on the carrier 110b, and the carrier 110b is positioned between the patterned circuit layer 120 and the heat dissipation fin 170e.

As shown in FIG. 5, the heat generated by the heat source 10 can be transferred from the patterned circuit layer 120 to the fluid channel 122 for heat dissipation, and can also sequentially pass through the patterned circuit layer 120, the dielectric layer 140, the carrier 110b and the heat dissipation fin 170e so as to be transferred to the external environment for heat dissipation. Therefore, the circuit board structure 100e of the present embodiment can quickly transfer the heat generated by the heat source 10 to the outside, having a better heat dissipation effect.

It is worth mentioning that the orthographic projections of the heat dissipation fins 170c, 170d and 170e in FIG. 3, FIG. 4 and FIG. 5 on the carriers 110a and 110b are overlapped with the orthographic projections of the heat dissipation section 125 of the fluid channel 122 on the carriers 110a and 110b. Therefore, the high-temperature heat dissipation fluid 30 flowing to the heat dissipation section 125 can exchange the heat with the heat dissipation air provided by the external environment through the heat dissipation fins 170c, 170d and 170e so as to achieve the purpose of quick heat dissipation. Of course, in other embodiments not shown, the orthographic projection of the heat dissipation fin on the carrier can also be overlapped with the orthographic projection of the heat absorption section of the fluid channel on the carrier, which is still within the protective scope of the present invention.

In conclusion, in the design of the circuit board structure of the present invention, the patterned circuit layer is provided with the fluid channel therein, and the heat absorption section of the fluid channel is adjacent to the heat source. Therefore, the heat generated by the heat source is transferred from the patterned circuit layer to the heat absorption section of the fluid channel, and is transferred from the heat absorption section to the heat dissipation section for heat dissipation. Thus, the circuit board structure of the present invention can quickly transfer the heat generated by the heat source to the outside, having a better heat dissipation effect.

Although the present invention has been disclosed above by way of embodiments, it is not intended to limit the present invention. Any person having ordinary knowledge in the art can make some changes and refinements without departing from the spirit and scope of the present invention. Therefore, the protection scope of the present invention is defined by the scope of the appended claims.

What is claimed is:

1. A circuit board structure suitable for carrying at least one heat source, comprising: a carrier; wherein the carrier is an insulating substrate, a patterned circuit layer, directly disposed on the carrier, wherein the patterned circuit layer is provided with at least one fluid channel therein; the at least one fluid channel is provided with a heat absorption section and a heat dissipation section relative to the heat absorption section, the at least one heat source is electrically connected to the patterned circuit layer, the heat absorption section is adjacent to the at least one heat source, and the heat generated by the at least one heat source is transferred from the patterned circuit layer to the heat absorption section of the at least one fluid channel, and is transferred from the heat absorption section to the heat dissipation section for heat dissipation; an adhesive material, disposed between the at least one heat source and the patterned circuit layer, and an orthographic projection of the adhesive material on the carrier is substantially equal to an orthographic projection of the heat source on the carrier; and a heat dissipation fin, wherein an orthographic projection of the heat dissipation fin on the carrier is overlapped with an orthographic projection of the heat dissipation section of the at least one fluid channel on the carrier, wherein an orthographic projection of the at least one heat source on the carrier is overlapped with an orthographic projection of the heat absorption section of the at least one fluid channel on the carrier, and wherein the at least one fluid channel comprises a plurality of fluid channels, and the plurality of fluid channels are separately positioned in the patterned circuit layer; and further comprising: a heat sink, embedded in the carrier and provided with a first surface and a second surface opposite to each other, wherein the first surface is in direct contact with the patterned circuit layer, and the second surface is aligned with a lower surface of the carrier.

2. The circuit board structure according to claim 1, wherein a material of the insulating substrate comprises epoxy glass cloth laminate, epoxy resin, prepreg or ceramics.

3. The circuit board structure according to claim 1, further comprising: a dielectric layer, disposed on the lower surface of the carrier, wherein the heat dissipation fin is disposed on the dielectric layer, and the dielectric layer is positioned between the carter and the heat dissipation fin.

4. The circuit board structure according to claim 1, further including: a dielectric layer, disposed on the patterned circuit layer, wherein the heat dissipation fin is disposed on the dielectric layer, and the dielectric layer is positioned between the patterned circuit layer and the heat dissipation fin.

5. The circuit board structure according to claim 1, wherein the carrier is a metal substrate, and a material of the metal substrate comprises copper, aluminum or alloy.

6. The circuit board structure according to claim 5, further comprising:
   a dielectric layer, disposed between the patterned circuit layer and the carrier.

7. The circuit board structure according to claim 6, wherein a heat conductivity coefficient of the dielectric layer is greater than 1 W/(m·K).

8. The circuit board structure according to claim 5, wherein
   the heat dissipation fin, is disposed on the carrier, and the carrier is positioned between the patterned circuit layer and the heat dissipation fin.

9. The circuit board structure according to claim 1, wherein the adhesive material comprises solder, conductive paste or dielectric paste.

10. The circuit board structure according to claim 1, wherein the at least one fluid channel is filled with a heat dissipation fluid, and the heat dissipation fluid circulates between the heat absorption section and the heat dissipation section.

11. The circuit board structure according to claim 10, wherein the heat dissipation fluid is a dielectric fluid, and the dielectric fluid comprises liquid or gas.

12. The circuit board structure according to claim 1, wherein a thickness of the patterned circuit layer is between 10 microns and 75 microns.

13. The circuit board structure according to claim 12, wherein a pore size of the at least one fluid channel is between 5 microns and 50 microns.

14. The circuit board structure according to claim 1, wherein the at least one heat source comprises at least one chip or at least one package.

15. The circuit board structure according to claim 1, wherein the at least one heat source is electrically connected to the patterned circuit layer by at least one wire.

* * * * *